United States Patent [19]

Stampfli

[11] Patent Number: 4,674,175
[45] Date of Patent: Jun. 23, 1987

[54] PROCESS FOR MANUFACTURING ELECTRONIC MODULES FOR MICROCIRCUIT CARDS

[75] Inventor: Jean-Marcel Stampfli, Le Landeron, Switzerland

[73] Assignee: ETA SA Fabrique d'Ebauches, Granges, Switzerland

[21] Appl. No.: 846,936

[22] Filed: Apr. 1, 1986

[30] Foreign Application Priority Data

Apr. 2, 1985 [FR] France ............... 85 05109

[51] Int. Cl.⁴ ........................................... H01L 21/56
[52] U.S. Cl. ....................................... 29/588; 29/841; 29/856; 29/589; 29/835; 425/DIG. 13; 235/492; 235/488; 283/86; 283/72
[58] Field of Search .................. 29/841, 856, 588, 589, 29/835; 156/235, 283; 235/492, 488; 425/DIG. 13; 283/86, 72

[56] References Cited

U.S. PATENT DOCUMENTS

| 4,460,825 | 7/1984 | Haghiri-Tehrani et al. | ........ 235/488 |
| 4,501,960 | 2/1985 | Jouvet et al. | ........ 235/488 |
| 4,625,102 | 11/1986 | Rebjock et al. | ........ 235/492 |

FOREIGN PATENT DOCUMENTS

3130189  2/1983  Fed. Rep. of Germany .
2095175  3/1981  United Kingdom .

Primary Examiner—Brian E. Hearn
Assistant Examiner—Beverly A. Pawlikowski
Attorney, Agent, or Firm—Kevin McMahon

[57] ABSTRACT

The invention relates to microcircuit cards, used for electronic transactions or other purposes, and concerns a process for mass producing electronic modules to be used in these cards and the modules obtained according to this process. According to the invention, there are fabricated, on the one hand, a metal grid with a plurality of openings into which there penetrate tongues attached to the frame of this grid and intended to form the modules' contact areas, and, on the other hand, pellets of plastics material which have a generally flat front face, a rear face in which there is a hollow and, between this hollow and the front face, windows so arranged that they can be positioned opposite the grid tongues. Then a pellet is attached by its front face to the tongues in each opening, an integrated circuit chip is bonded to the bottom of the hollow in each pellet in such a way that its rear face is directed towards the grid, the connecting terminals of the chip are connected by means of conductors to the tongues to which the pellet is attached, said conductors being seated in the hollow in the pellet and passing through the said windows, and the hollow and the windows are filled with an insulating, hardenable and adhesive material. There then remains only to detach the modules from the grid by cutting the tongues around each pellet.

20 Claims, 22 Drawing Figures

PROCESS FOR MANUFACTURING ELECTRONIC MODULES FOR MICROCIRCUIT CARDS

FIELD OF THE INVENTION

The present invention relates to a process for manufacturing electronic modules for microcircuit cards such as credit cards, bank cards, car park cards, telephone call payment cards for public call boxes, etc, and the modules obtained by implementing this process.

DESCRIPTION OF THE PRIOR ART

In the form in which they are currently known, microcircuit cards, which are also known as memory cards or intelligent cards, generally comprise, as their electronic circuit, an integrated memory and microprocessor in the form of a single chip or of two chips connected to each other by electric conductors and a set of contact areas, often eight in number, which are connected to the microprocessor and which are accessible to the connecting elements of an apparatus, for example a computer terminal, into which the card is designed to be inserted.

In certain cases these various elements are, with the exception of the contact areas, embedded in a homogeneous or composite insulating body to form a pellet which is then placed in a corresponding opening in the body of the card. In other cases, they are incorporated directly into the card body.

Irrespective of questions to do with the integrated circuit itself, such as, for example, what information the memory has to contain, what functions the microprocessor must perform and how this memory and this microprocessor are designed, the insertion of an electronic circuit into a transaction card poses a certain number of problems, in particular because of the somewhat numerous demands made on it.

First of all, a microcircuit payment card has to have the same format as a conventional card with standardized magnetic tracks, such a card being 85 mm long, 54 mm wide and 0.76 mm thick (ISO standards), or at least have similar dimensions so as to remain easily manageable and unbulky.

If it is taken into account, firstly, that a thickness of 760 microns corresponds approximately to only twice the thickness of an unprotected integrated circuit chip, secondly that the portion of the card's surface which can be allocated to the electronic circuit is very limited given that the majority of it has to be kept for inscriptions such as the name of the person issuing the card, the identity of the bearer, a signature, information on use and, possibly, a photo and thirdly that the conductive areas must be large enough to ensure contact with the connecting elements of an apparatus, it is very easy to understand that it is not feasible to use ready-coated or encapsulated standardized circuits which can at present be found on the market and which are too bulky.

It is therefore necessary, in the fabrication of cards or electronic modules intended therefor, to start with bare integrated circuit chips, for the manufacturer himself to construct the interconnecting network which allows the chips to be electrically connected with the outside and to each other if there are several of them in one card, and to ensure the protection of the whole assembly, which is very fragile especially at the junctions between conducting elements (connecting terminals of chips, wires etc.).

This protection must be all the more effective as the cards will inevitably be frequently subjected to a degree of deformation which may be considerable, owing to the fact that these cards, like conventional cards, are expected to meet relatively rigorous standards or requirements of flexibility. Protection cannot therefore be afforded by making the electonic modules or the areas of the cards where the circuits are located as rigid as possible, because the conditions of flexibility in question would not be fulfilled.

Furthermore, it is necessary to prevent outside agents such as light or moisture from damaging the circuit or disturbing its operation.

Finally, it is quite clear that it must be possible to mass produce the cards at a low cost, especially if they are cards which are given a certain initial value to be paid on purchase and which, when this value is exhausted, have simply to be thrown away.

The aim of the invention is to provide a satisfactory solution to these various problems.

SUMMARY OF THE INVENTION

According to the invention, to fabricate electronic modules which can then be incorporated in card bodies and which comprise an integrated circuit chip with a front face provided with connecting terminals and a rear face and a set of metal contact areas each connected to one of the chip's connecting terminals, the following steps are carried out:

there is provided a metal grid comprising a plurality of identical openings defined by a frame and, in each opening, a set of tongues attached to the frame and intended to form the contact areas of a module;

there is also provided a series of pellets of synthetic material, these being smaller than the openings in the grid and each one having an approximately klat front face, a rear face in which there is located a hollow and, between this hollow and the said front face, windows so arranged that they can each be positioned opposite one of a set of tongues;

a pellet is attached by its front face to each set of tongues in such a way that the windows in question are actually opposite the tongues;

an integrated circuit chip is attached to the bottom of the hollow in each pellet in such a way that its rear face is directed towards the grid;

the chip's connecting terminals are connected to the tongues to which each pellet is attached, by means of conductors located in the hollow in the pellet and passing through the windows;

the hollow and windows in each pellet are filled with an electrically insulating, hardenable, adhesive material.

To fix the chips inside the pellets and connect their connecting terminals to the tongues it is possible to begin either by adhering each chip to the bottom of the hollow in a pellet and then soldering each conductor firstly onto one of the said chip's connecting terminals and then onto the corresponding grid tongue or by soldering the conductors by one of their ends onto the chip connecting terminals, adhering the chips to the bottoms of the hollows in the pellets and finally soldering the other conductor ends onto the tongues.

When the modules are completed, the manufacturer himself can detach them from the grid by cutting the tongues around each pellet or leave this task to the person who purchases these modules to incorporate them in cards.

This process necessitates only a few operations and allows modules to be manufactured in very large quantities, from relatively cheap products and using manufacturing techniques which are now very well established in the field of electronics.

BRIEF DESCRIPTION OF THE DRAWINGS

Other characteristics and advantages of the invention will become apparent in the course of the following detailed but non-limiting description of two possible ways of implementing it.

This description will be made with reference to the attached drawings in which.

FIGS. $2_a$ and $2_b$ are views respectively of the back and front of a pellet of plastics material which is also manufactured according to this same method.

FIG. $2_c$ is a sectional view of the pellet along the broken line II-II to be seen in FIG. $2_a$.

FIG. $5_a$ is a partial plan view of a tongue of FIG. 4, showing better the shape of the lugs.

FIG. $5_b$ shows, viewed from above, the tongue of FIG. $5_a$ when the lugs are folded over at right angles.

FIG. $6_a$ is a partial rear view of a pellet, with an integrated circuit chip and the connections between the chip terminals and the grid tongues after they have been effected.

FIG. $6_b$ is a sectional view along the broken line VI-VI to be seen in FIG. $6_a$.

DESCRIPTION OF THE PREFERRED EMBODIMENTS

Figure 1:
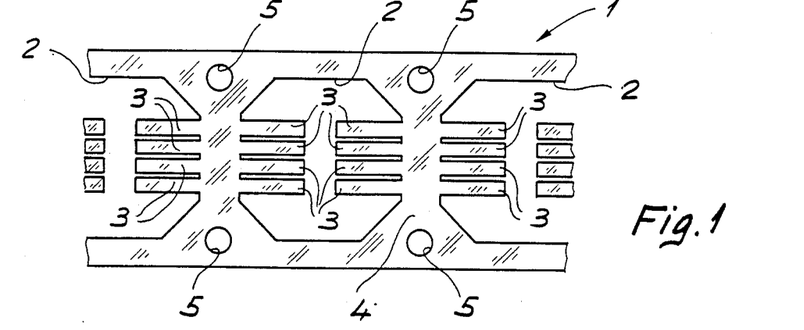
FIG. 1 is a partial plan view of a grid fabricated according to the first of the methods of implementing the invention.

To produce electronic modules in accordance with the method of implementing the process according to the invention which we have chosen to describe first, the manufacturer begins by fabricating a metal grid 1 in the form of a strip, as is shown partially in FIG. 1, and pellets 6 of synthetic material, as shown in FIGS. $2_a$, $2_b$ and $2_c$.

The grid 1 is intended not only to form the contact areas of the modules but also to support the modules throughout their manufacture, enabling them to move on a machine and to be transferred from one machine to another, so that they can be manufactured in the most automated manner possible.

To this end the grid 1 has, on the one hand, a plurality of identical openings 2 spread out at regular intervals along its central portion and each having projecting into it tongues 3 which are attached at one end to the frame 4 of the grid and free at the other end and which will constitute the contact areas. On the other hand it has, along each of its edges, a series of equidistant perforations 5 which will allow it to be positioned and moved along step by step in front of the various tools which will be used to manufacture the modules.

As is shown in the Figure, the openings 2 are octagonal, the perforations 5 are located between the openings, and the tongues 3, which number eight per opening, all have the same rectangular shape and the same dimensions, and are positioned both parallel to the edges of the grid and symmetrically in relation to the median planes of the openings, these being perpendicular to the grid edges.

Of course, this is only one example of the possible grid configuration. The shape of the openings and the position of the perforations in relation to them could be different without this altering in any way the module manufacturing process. The same is true as far as the number of tongues, their shape and their position in the openings are concerned, although those selected correspond, in point of fact, to the contact area design which is at present the most widespread and which is becoming ever more so in the case of transaction cards.

Whatever the grid pattern chosen, it can always be easily manufactured from a metal strip which is cut in the conventional manner, either mechanically or by chemical attack.

Preferably, a strip is chosen which already possesses the qualities which the module contact areas must have, that is to say good resistance both to wear by contact or by friction and to atmospheric corrosion or corrosion by other agents liable to damage them.

The strip can, for example, be of nickeled and gilded copper or, better still, of a rustproof alloy such as nickel silver or especially the alloy which is marketed under the trade mark "ARCAP" by the French company ARCAP Anticorrosion and which comprises approximately 56% copper, 25% nickel, 17% zinc and 2% other metals.

By virtue of this choice it is possible to avoid having to treat galvanically if not the whole grid then at least the parts which will form the contact areas.

Figure 2A:
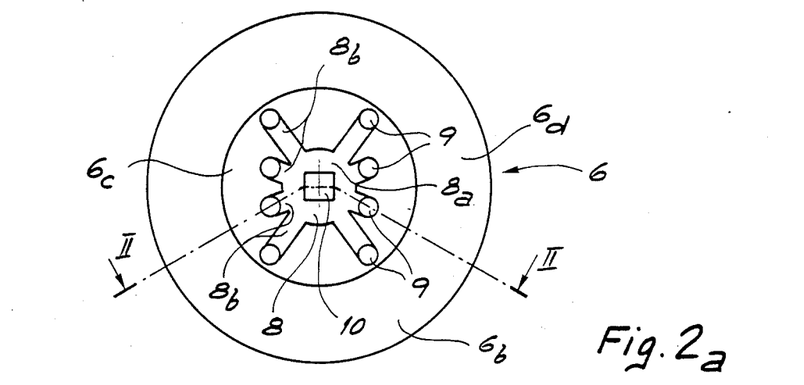
Figure 2B:
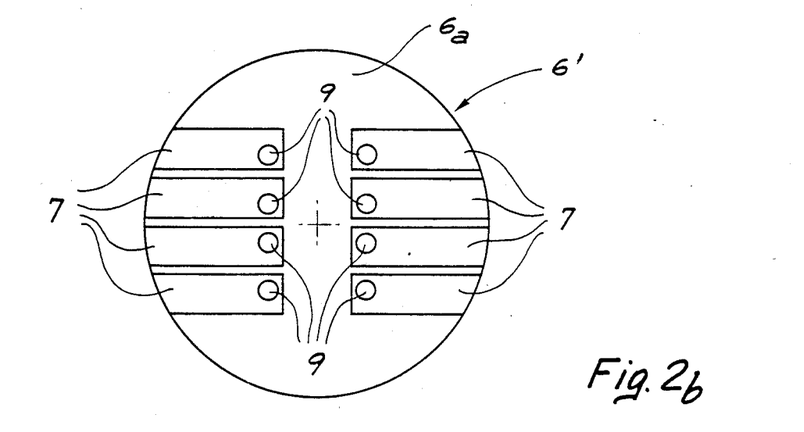
Figure 2C:
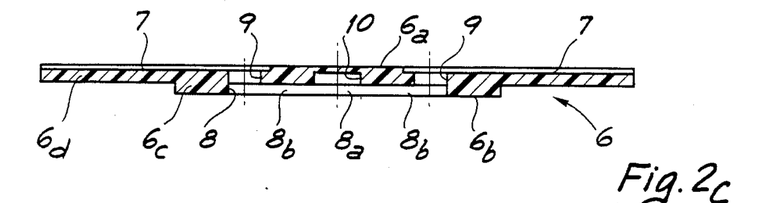

As for the pellets 6, they are preferably injection moulded using a thermoplastic material having more or less the same elasticity characteristics as that which will be used in the manufacture of the bodies of the cards into which the modules will be inserted, this material being most frequently polyvinylchloride, commonly known by the abbreviation PVC. Furthermore, this material must be a very good electric insulator which is unlikely to lose its insulating quality by absorbing water or other substances with which the cards could be brought into contact. The material could, for instance, be phenylene polysulfide (PPS) or another polysulfide, or a polysulfone, a polycarbonate, or a polyester which meets the above-mentioned requirements.

Each pellet 6 is in the form of a disk which is slightly smaller than the openings 2 in the grid 1 and which has one essentially flat face $6_a$ and a circular central part $6_c$ which is thicker than the peripheral part $6_d$ which surrounds it. For example, the diameter of the central part $6_c$ can be about half that of the disk and its thickness approximately one and a half times that of the peripheral part $6_d$.

As FIG. $2_b$ shows, the pellet has shallow channels 7 in its flat or front face $6_a$, these being provided to receive the tongues 3 from any one of the openings in the grid.

The shape, size and depth of these channels are such that the tongues fill them totally without slipping out of them.

Furthermore, as may be seen from FIGS. $2_a$ and $2_c$, the pellet also has, in its rear face $6_b$, a hollow 8 formed by a central space $8_a$ and a series of radial grooves $8_b$ which extend from this space to the windows 9 which are provided between the hollow and the front face $6_a$ of the pellet and which each open into one of the channels 7.

Finally, at the bottom and in the centre of the hollow 8 there is a cavity 10 intended to hold an integrated circuit chip.

It should be noted that it is also possible for the hollow 8 to be simpler in shape, for example round or rectangular, the windows 9 still being located in the bottom of it.

Figure 3:
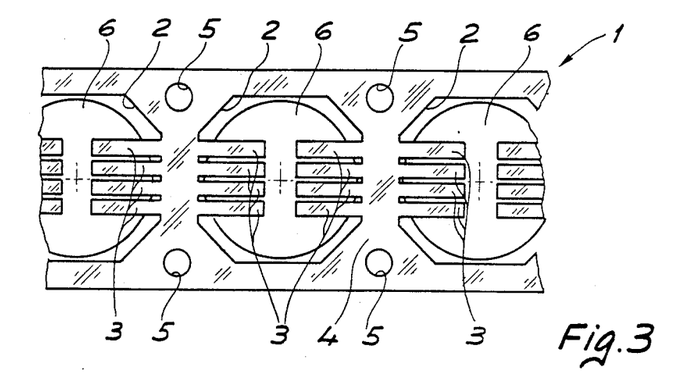
FIG. 3 shows how pellets such as that of FIGS. $2_a$ and $2_c$ are attached to the tongues in the grid of FIG. 1, these being intended to form the modules' contact areas.

Once the manufacturer has at his disposal the grid 1 and pellets 6, each of these pellets is attached by its front face $6_a$ to the tongues 3 in an opening 2 in the grid, in such a way that the tongues are located in the pellet channels 7 provided to receive them, as is shown in FIG. 3.

This attachment can be achieved by adhesion or by thermal soldering, but it is preferable to use ultrasonic soldering techniques, as these ensure a much firmer connection between the tongues and the pellet.

Figure 4:
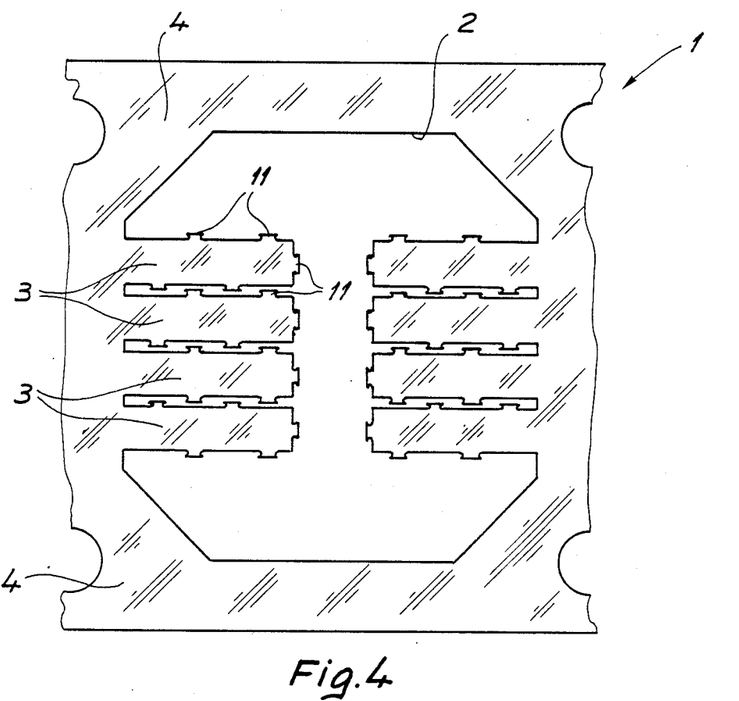
FIG. 4 is a partial, enlarged view of the grid of FIG. 1, showing the lugs with which the tongues are provided when the pellets are soldered onto the grid ultrasonically.

If this method of soldering is in fact decided upon, lugs 11 must be provided around each tongue when the grid is manufactured, as may be seen from the enlarged view in FIG. 4. Each tongue may, for example, have five lugs, two on each side and one at the end.

Figures 5A, 5B:
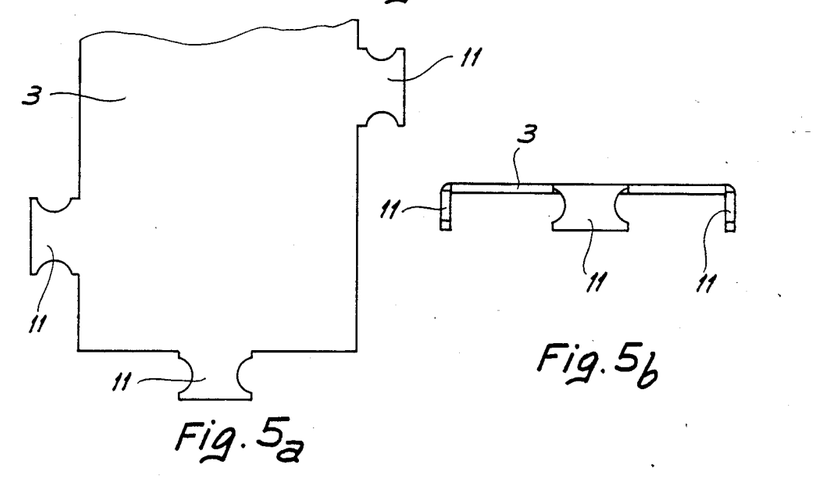

For a reason which will become clear below it is advantageous to give the sides of these lugs an inwardly curving or "V" shape, as FIG. $5_a$ shows, so that they are narrower at the centre than at the ends.

After the grid has been cut off the lugs are folded over at an angle of 90° on the side where the pellets are located, as is illustrated by FIG. $5_b$.

Thus, when a pellet has been positioned opposite an opening in the grid, pressure is exerted on the tongues 3 while they are subjected to ultrasonic vibrations, the plastics material being caused to heat up and soften mainly in the region of the lugs. The lugs will then be able easily to penetrate the material and when, after the soldering operation, the material has once again become solid, they will be firmly anchored in it, especially if, rather than simply having straight sides, they have the shape indicated above or an equivalent shape such as, for example, that of a trapezium whose narrow base is located next to the tongue to which they are attached.

Depending on what equipment the manufacturer has at his disposal or has provided for the fabrication of the modules, he can either firstly attach all the pellets to the grid before moving on to the next stage and then do the same for all the other operations, or he can use the production line method, that is to say not to wait until one operation is completely finished before starting the next one and therefore to carry out several at the same time on different units. We will assume below that the first is the case.

Figure 6A:
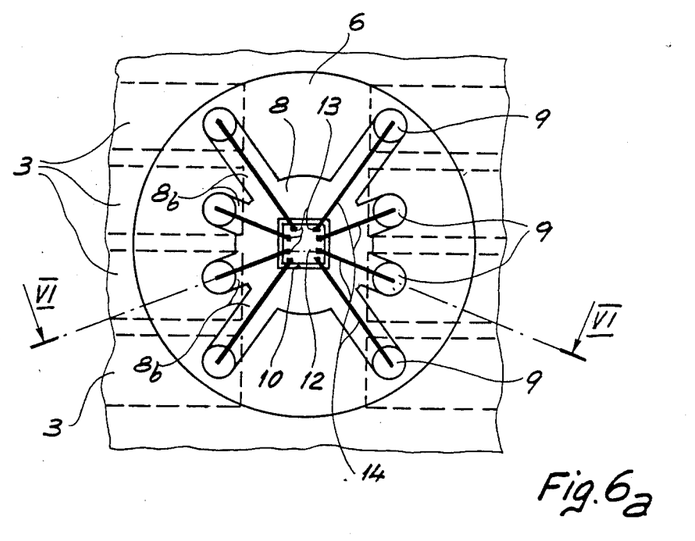
Figure 6B:
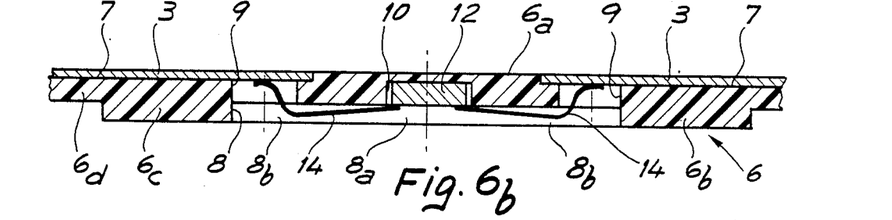

Therefore, after the pellets have been attached to the grid, the next step is to adhere an integrated circuit chip 12 to the seat 10 reserved for this purpose in each pellet (see FIGS. $6_a$ and $6_b$), obviously in such a way that the chip's front face provided with connecting terminals 13 is located on the opposite side of the grid. Each of these terminals is then connected to a tongue 3, by sliding a conductor 14 into a groove $8_b$ and the corresponding opening 9 and ensuring that no part of the conductor projects from the hollow 8.

There are two ways of doing this. The first method consists first of all in adhering the chip 12 to its seat and then using the wire connecting technique, better known by its English name "Wire Bonding", to solder a first fine wire, for example of aluminum, firstly onto a chip connecting terminal in the form of a contact area and then onto the corresponding grid tongue, then to solder a second wire onto another chip terminal and another tongue and so on.

The other possibility is to start by providing the chip with connecting tags soldered onto its terminals which in this case are bumps, this being done by employing one of the well known techniques generally referred to be the English expressions "Beam Lead", "Tape Automated Bonding" (abbreviation T.A.B.) and "Flip Chip", then to place the whole assembly in the hollow 8 in the pellet while adhering the chip to its seat, the connecting tags of course being positioned in such a way as to be in the grooves 8b, and finally to solder the ends of these tags onto the grid tongues.

Figure 7:
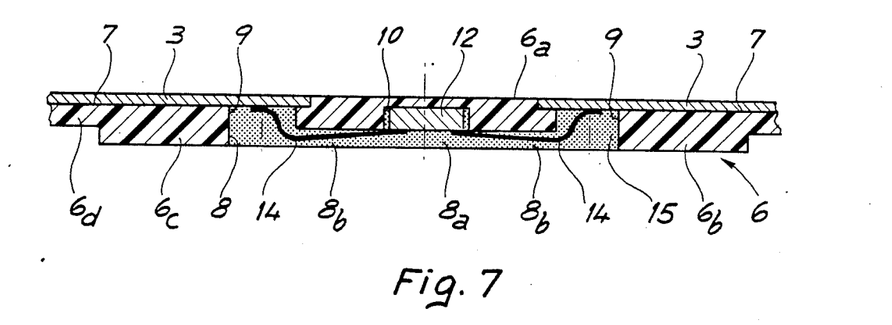
FIG. 7 is a sectional view similar to that of FIG. $6_b$ but showing a completed module.

The next stage, illustrated by FIG. 7, consists in filling the hollow 8 and the windows 9 in each pellet, and possibly also the space surrounding the chip in its cavity 10, with an adhesive, insulating, hardenable and preferably opaque material to protect the chip 12 which the pellet contains against the light at least until the module is inserted into a card. This material may, for example, be a silicone- or epoxy-based resin.

Figure 8:
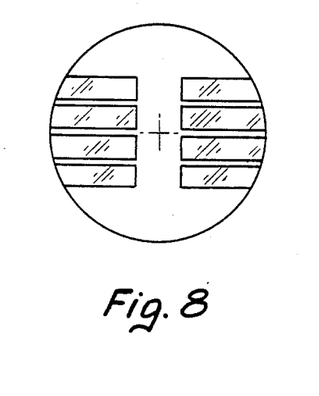
FIG. 8 is a front view of the said completed module.

All that then remains is to cut the tongues 3 following the outline of each pellet 6 to obtain a series of modules like the one shown, viewed from the front, in FIG. 8.

This last operation may be carried out by the manufacturer of the modules if he does not himself produce the cards, in which case these modules will be delivered loose, generally after being tested, or it may be carried out by the customer.

Figure 9:
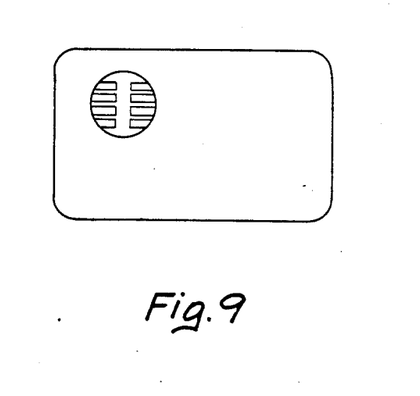
FIG. 9 is a diagrammatic representation of the module incorporated in a card.

Each module can then be adhered to a seat of a complementary shape provided in a card body, for example as is shown in FIG. 9 which is how it is most often done, that is to say in the top left-hand corner of the body when it is viewed from the front.

This seat may be an opening if the module is of the same thickness as the card body, or a cavity if the module is thinner. The second possibility presents two advantages over the first: the chip and the conductors are better protected and the connecting surface between the card and the module is greater, the module being less likely to come unstuck as a result of the frequent bending of greater or lesser severity to which the card will be subjected when in use.

Finally, to finish with this first method of implementing the process according to the invention, there remains to indicate why it was decided to produce the modules in the form of disks which are thicker in the centre than at the edge rather than having two flat parallel faces. The reason is that because of this the stresses which the card body will suffer when it is subjected to bending or twisting will be, if not eliminated, at least very greatly eased at the boundary between the thin and thick parts of the disk. The integrated circuit chip, the conductors and the soldered joints between the chip's connecting terminals and the contact areas will thus be much better protected from a mechanical point of view.

The second method of implementing the invention, which will be described now, in fact has many points in common with the first. We shall therefore mainly concentrate on detailing the differences which exist between the two.

On the other hand, the items or parts of items which are identical or equivalent to those which have been under consideration up to now will be designated by the same reference numerals, with the addition of the sign "'".

This second method of implementation is suitable if the substrate of the chip bearing the integrated circuit has to be earthed.

Figure 10:
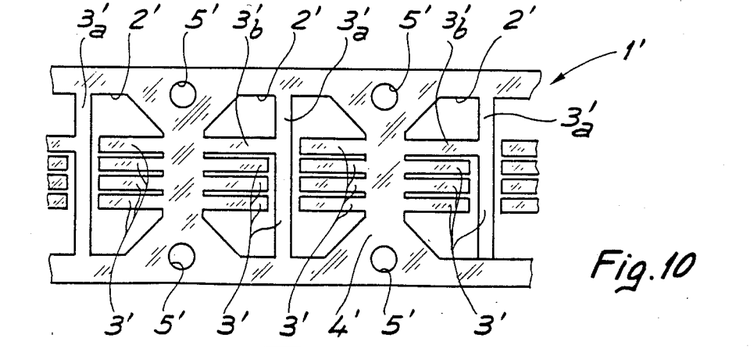
FIGS. 10, $11_a$, $11_b$, $11_c$, 12, $13_a$, $13_b$, and 14 are views corresponding respectively to those in FIGS. 1, $2_a$, $2_b$, $2_c$, 3, $6_a$, $6_b$, and 7 but illustrating the second method of implementing the invention.

Once again the manufacturer begins be fabricating, on the one hand, a grid 1' in the form of a strip such as is shown in FIG. 10 and, on the other hand, pellets 6' of synthetic material like the one shown respectively from the rear and from the front in FIGS. $11_a$ and $11_b$ and, in FIGS. $11_c$, in section along the broken line XI—XI to be seen in FIG. $11_a$.

The grid 1' also has perforations 5' to drive it, openings 2' and tongues 3' extending inside the openings, but in each group of tongues there is one which has a special shape. This tongue comprises a main, straight part $3_a'$ which crosses the centre of the opening in which it is located and which is attached by its two ends to the frame 4' of the grid, and a branch $3_b'$ which extends from this central part to the frame to which it is also attached and which replaces one of the tongues 3 of the grid of FIG. 1. As for the other tongues 3', they have the same shape and are in the same position as before.

Figure 11A:
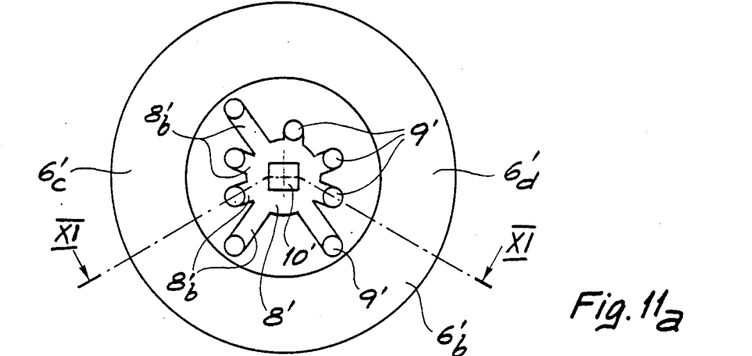
Figure 11B:
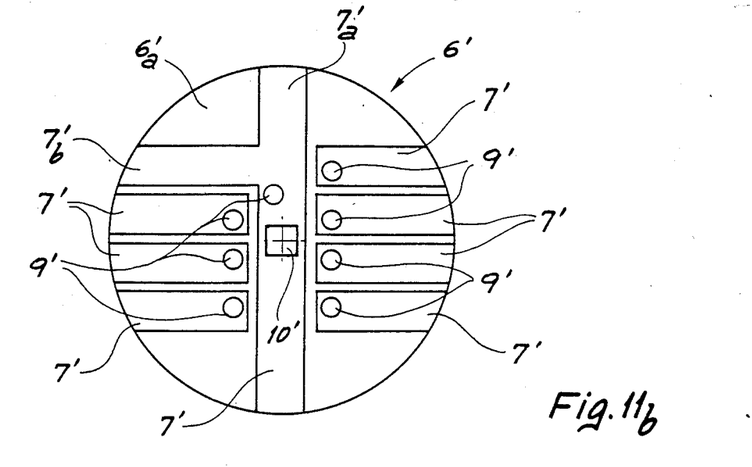
Figure 11C:
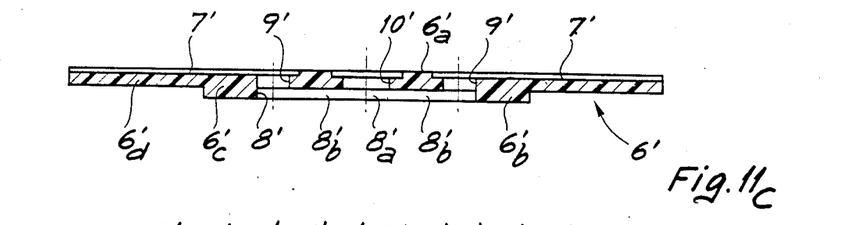

Furthermore, each pellet is still in the form of a disk with a practically flat front face $6_a'$, a peripheral part $6_d'$ which is thinner than the central part $6_c'$ and a hollow 8' in this central part.

However, if the pellet 6' of FIGS. $11_a$ to $11_c$ is compared with that, 6, of FIGS. $2_a$ to $2_c$ it will be seen that there are three differences.

The first, which concerns the channels in the front faces of the pellets, is imperative. It is in fact obvious that one of the channels 7' must also comprise a main part $7_a'$ and a branch $7_b'$ so that their configuration is adapted to that of the tongues 3' in the grid 1'.

The second is that the integrated circuit chip cavity 10 in the pellet has been replaced by an opening 10' which opens into the main part $7_a'$ of the special channel 7 and the third stems from the fact that the hollow 8' in the pellet 6' is not exactly the same shape as the one, 8, in the pellet 6, considering that one of the windows 9' opens into the main part of the channel in question. In reality, this last difference is unimportant as it could very easily be done away with by causing this window to open into the branch $7_b'$.

Figure 12:
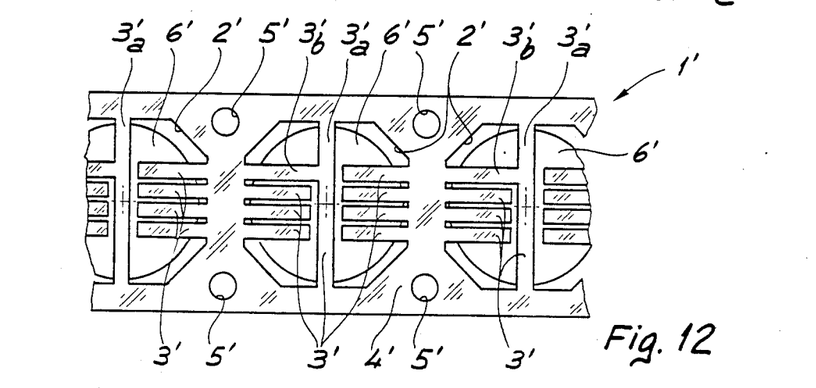
Figure 13A:
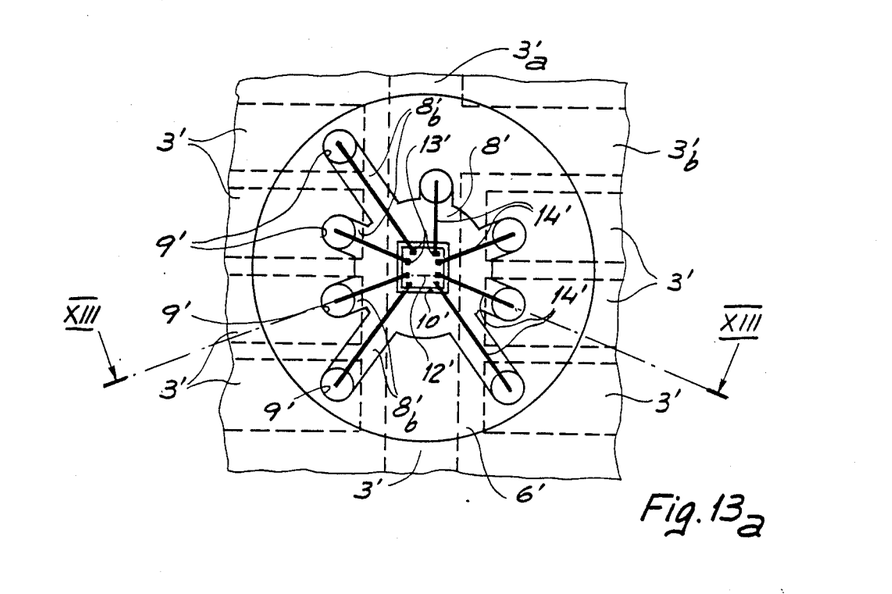
Figure 13B:
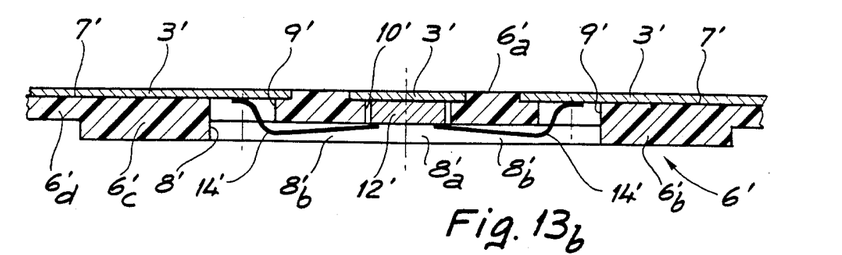
Figure 14:
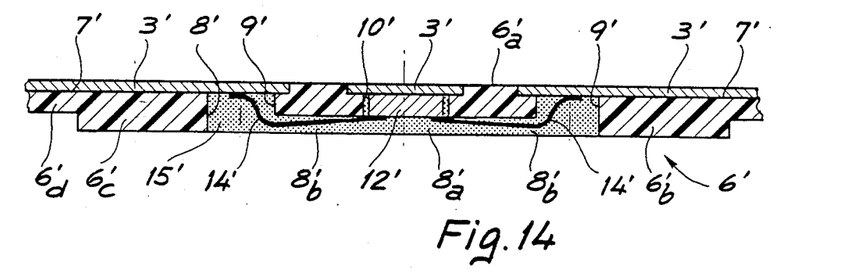

As in the first method of implementation, the next stages consist in fixing the pellets 6' onto the grid 1' (see FIG. 12), preferably using ultrasonic soldering, in adhering the chips 12' to the seats 10' reserved for them, in joining the connecting terminals 13' of the chips to the tongues 3' by means of the conductors 14', according to either one of the methods indicated above (see FIGS. $13_a$ and $13_b$, FIG. $13_b$ being a sectional view along the broken line XIII—XIII to be seen in FIG. $13_a$) and in filling the hollows 8' with an insulating, adhesive material 15' (see FIG. 14). Here, however, the chips 12' are adhered by means of a conductive adhesive to the main parts $3_a'$ of the special tongues 3' which, of course, are connected to the earth terminals.

It then only remains to separate the modules from the grid, there being two possible ways of doing so.

The first is to cut all the tongues around the pellet at the same time. This can be done by the module manufacturer or by the customer provided that the latter can test these modules himself.

Figure 15:
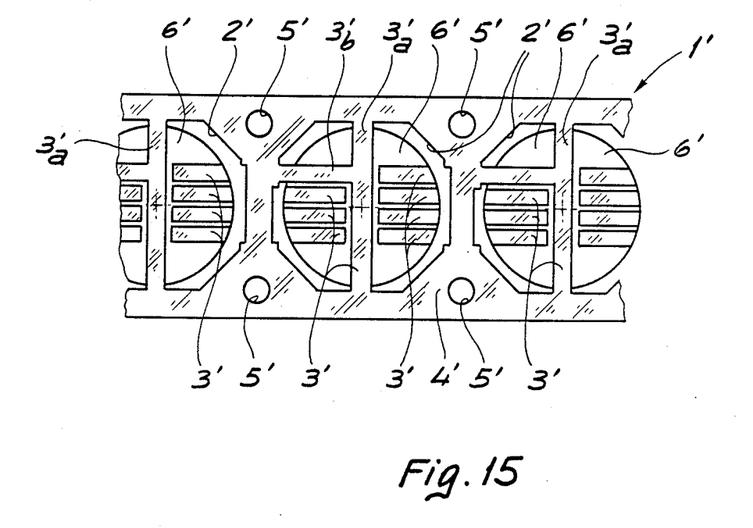
FIG. 15 shows how, in this second method, the modules may be left attached to the grid framework for testing and delivery in strip form.

The second, which often proves advantageous and which is illustrated by FIG. 15, is at first to cut only the tongues which had a free end at the outset, that is to say those which constitute the contact areas which are not connected to the earth terminal of a chip. The manufacturer who takes charge of this operation can, having tested the modules, supply them in a strip to the client, who then only has to cut the special tongues in order to be able to insert the modules into cards.

Although not excluded, this second technique is not envisaged in the context of the first method of implementation as, in this case, the modules would only be supported after the first cutting stage by a tongue attached by merely one end to the grid. There would thus be a risk that the grid might break or tear away at least partially from the pellet to which it is connected and delivery of these modules in strip form could only be effected with special precautions.

In contrast, with a tongue which remains fixed to the grid at three points this problem does not arise.

Of course, the invention is not restricted to the two methods of implementation which have just been described.

For example, rather than being in the form of a strip the grid could be in that of a rectangular or square plate, with the openings spread out regularly in lines and columns, which plate could be moved in two perpendicular directions in front of the various tools used in module manufacture.

Similarly, the pellets of synthetic material which define the shape of the modules do not have to be round. They could also be rectangular, square or otherwise.

It is also possible, when there is no need for the integrated circuit substrate to be earthed, that the difference in thickness between the pellet and chip be sufficiently large for it to be unnecessary to provide a cavity to hold the chip, which could then be adhered to the then flat bottom of the hollow in the pellet.

Elsewhere we have indicated the advantages of there being a difference in thickness between the central and peripheral parts of the pellets, but this does not exclude the possibility of giving these pellets a uniform thickness.

As far as the channels for receiving the tongues are concerned, it is clear that their presence is very useful because they allow the modules to have a perfectly flat front face without creating excess thickness when they are placed in the cards. Furthermore, thanks to them there is no danger of the contact areas being torn out, as there is when they are simply adhered or thermally soldered onto the pellets. In spite of this, it would be possible to do away with them.

Moreover, instead of soldering the ends of the conductor onto the connecting terminals of the chips and onto the tongues, they could be adhered with a conductive adhesive.

Finally, it is clear that it would be possible to provide each module not with one single chip but with two or more connected together, not necessarily located in the same cavity or opening at the bottom of the hollow in the pellet, but one of which at least would be connected to the contact areas.

I claim:

1. A process for fabricating electronic modules for microcircuit cards, each module comprising an integrated circuit chip with a front face provided with connecting terminals and a rear face and a set of metal contact areas each connected to one of the chip's connecting terminals, the process comprising the following steps:

providing a metal grid comprising a plurality of identical openings defined by a frame and, in each opening, a set of tongues attached to the frame for forming the contact areas of a module;

providing a series of pellets of synthetic material, these being smaller than the openings in the grid and each one having a generally flat front face, a rear face in which there is located a hollow and, between this hollow and said front face, windows so arranged that they can be positioned opposite the tongues respectively of one of said sets of tongues;

attaching each said pellet of said series by its front face to one of said sets of tongues in such a way that said windows are actually opposite these tongues;

attaching an integrated circuit chip to the bottom of said hollow in each said attached pellet so that the rear face of said integrated circuit is directed towards the said grid;

connecting said chip's connecting terminals to said tongues to which said pellet is attached by means of conductors located in the hollow in said pellet and passing through said windows; and filling said hollow and said windows in each said pellet with an electrically insulating, hardenable, adhesive material.

2. A process according to claim 1, wherein to fix a chip inside a pellet and connect its connecting terminals to said tongues in said grid, said chip is first bonded to the bottom of said hollow in said pellet and then each said conductor is soldered at one end to one of said chip's connecting terminals and, at the other end, to the corresponding tongue.

3. A process according to claim 1, wherein, to fix said chips inside said pellets and connect their connecting terminals to said tongues in the said grid, said conductors are first soldered at one of their ends to said chips' connecting terminals, then said chips are bonded to the bottoms of said hollows in said pellets and finally the other conductor ends are soldered to said tongues.

4. A process according to claim 1, wherein said pellets are injection moulded.

5. A process according to claim 1, wherein said pellets are of thermoplastic material.

6. A process according to claim 1, wherein each said pellet has a central part, in which there are located said hollow and said windows, and a peripheral part which is thinner than said central part.

7. A process according to claim 1, wherein each said pellet is in the form of a disk.

8. A process according to claim 1, wherein said hollow has a central space and a set of grooves extending from said central space to said windows to receive said conductors.

9. A process according to claim 1, wherein said front faces of said pellets have channels adapted to the shape and dimensions of the said tongues, into which channels said windows open and into which said tongues are introduced when said pellets are fixed on to said grid.

10. A process according to claim 1, wherein said tongues have lugs along their sides which are folded over generally at right angles and wherein said pellets are fixed to said grid by causing the lugs to penetrate said synthetic material by untrasonic means.

11. A process according to claim 1, wherein said grid is a nickel silver.

12. A process according to claim 1, wherein each said pellet has, at the bottom of said hollow a cavity into which said chip is placed.

13. A process according to claim 12, characterised in that said tongues all have the same rectangular shape and the same dimensions and are all attached to said frame by one end only, and wherein, in each said opening, these tongues are eight in number and arranged in parallel with each other and symmetrically in relation to a median plane of the opening.

14. A process according to claim 12, wherein the modules are separated from said grid by cutting the tongues around each pellet.

15. A process according to claim 1, wherein each said set of tongues comprises a special tongue with a straight main part attached to its two ends to said frame and situated approximately in the middle of said opening in which it is located, and a branch also attached to said frame, the other tongues of said set being simply straight, attached by only one end to said frame and distributed on each side of said main part of said special tongue; wherein each said pellet has, at the bottom of said hollow and in addition to said windows, an opening which opens under the main part of said special tongue of the set to which it is fixed and in which said chip is seated, said chip's rear face being bonded by means of an electrically conductive adhesive to said main part; and wherein said special tongue is connected by one of said conductors to an earth connecting terminal with which said chip is provided.

16. A process according to claim 15, wherein said other tongues in said set number seven, all have the same rectangular shape and the same dimensions and are parallel to each other and to said branch of said special tongue, said branch also being rectangular and perpendicular to said main part, and wherein said tongues and said branch are arranged symmetrically in relation to said main part.

17. A process according to claim 15, characterised in that after said hollows in said pellets are filled at least said other tongues are cut round said pellets.

18. A process according to claim 1, wherein said adhesive material is an epoxy-based resin.

19. A process according to claim 1, wherein said adhesive material is a silicone-based resin.

20. A process according to claim 1, wherein said grid is in the form of a strip with said openings spread at regular intervals therealong.

* * * * *